US012787547B2

(12) United States Patent
Moon

(10) Patent No.: US 12,787,547 B2
(45) Date of Patent: Nov. 3, 2026

(54) THIN FILM TRANSISTOR SUBSTRATE AND DISPLAY APPARATUS COMPRISING THE SAME

(71) Applicant: LG Display Co., Ltd., Seoul (KR)

(72) Inventor: KyeongJu Moon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 402 days.

(21) Appl. No.: 18/521,835

(22) Filed: Nov. 28, 2023

(65) Prior Publication Data

US 2024/0224594 A1 Jul. 4, 2024

(30) Foreign Application Priority Data

Dec. 30, 2022 (KR) ........................ 10-2022-0191188

(51) Int. Cl.
*H10K 59/121* (2023.01)
*H10K 59/126* (2023.01)

(52) U.S. Cl.
CPC ..... *H10K 59/1213* (2023.02); *H10K 59/1216* (2023.02); *H10K 59/126* (2023.02)

(58) Field of Classification Search
None
See application file for complete search history.

(56) References Cited

U.S. PATENT DOCUMENTS 10,615,236 B2 * 4/2020 Lim ..................... H10D 86/443
10,741,126 B2 * 8/2020 Choi .................... G09G 3/3233
11,659,738 B2 * 5/2023 Wang ................... H10D 86/423 257/43
11,800,750 B2 * 10/2023 Moon ................ H10D 30/6704
11,937,456 B2 * 3/2024 Kim ...................... G09G 3/3266
11,980,066 B2 * 5/2024 Na ......................... G06F 3/0412
12,150,344 B2 * 11/2024 Kim ..................... H10D 86/481
2016/0284733 A1 * 9/2016 Lee ..................... H10D 30/0314
2017/0117304 A1 * 4/2017 Kim ..................... H10D 30/0314
2017/0155000 A1 * 6/2017 Moon ................ H10D 30/6704
2017/0186781 A1 * 6/2017 Noh ........................ H10D 1/692
2017/0278916 A1 * 9/2017 Maruyama ........... H10D 86/021
2017/0338252 A1 * 11/2017 Lee ..................... H10D 30/6723
2017/0365649 A1 * 12/2017 Kim ........................ H10D 1/692
2018/0012947 A1 * 1/2018 Lee ...................... H10D 86/421
2018/0151114 A1 * 5/2018 Choi ..................... G09G 3/3233

FOREIGN PATENT DOCUMENTS

KR 10-2017-0143082 A 12/2017
KR 10-2018-0062148 A 6/2018

* cited by examiner

*Primary Examiner* — Nishath Yasmeen
(74) *Attorney, Agent, or Firm* — Fenwick & West LLP

(57) ABSTRACT

Disclosed is a thin film transistor substrate comprising a substrate; a first thin film transistor including a first gate electrode, a first active layer, a first source electrode, and a first drain electrode; a second thin film transistor including a second gate electrode, a second active layer, a second source electrode, a second drain electrode, a first conductive layer and a second conductive layer, and capacitor electrode including a first layer and a second layer, wherein the first layer of the capacitor electrode is disposed on a same layer as the second active layer, and the second layer of the capacitor electrode is disposed on a same layer as the first conductive layer, and a display apparatus including the same.

18 Claims, 8 Drawing Sheets

THIN FILM TRANSISTOR SUBSTRATE AND DISPLAY APPARATUS COMPRISING THE SAME

CROSS-REFERENCE TO RELATED APPLICATION

This application claims the benefit of Republic of Korea Patent Application No. 10-2022-0191188 filed on Dec. 30, 2022, which is hereby incorporated by reference in its entirety.

BACKGROUND

Technical Field

The present disclosure relates to a substrate and apparatus including the same, and in particular, for example, without limitation, to a thin film transistor substrate and a display apparatus including the same.

Description of the Related Art

Since thin film transistors can be manufactured on glass or plastic substrates, they are widely used as switching devices or driving devices for displays such as liquid crystal display apparatus or organic/inorganic light emitting devices.

In general, a plurality of various thin film transistors is formed on the substrate. In this case, an active layer of one thin film transistor and an active layer of another thin film transistor may be formed at different positions. In this case, it becomes difficult to uniformly control the process of doping the dopant to the active layer of the one thin film transistor and the process of doping the dopant to the active layer of the other thin film transistor. Accordingly, there is a limitation that dopant doping is not carried out smoothly in some active layers, and the characteristics of thin film transistors including such active layers are degraded.

SUMMARY

The present disclosure has been made in view of the above limitations, and it is an object of the present disclosure to provide a thin film transistor substrate and a display apparatus that can prevent some thin film transistor properties from being degraded by dopant doping when multiple active layers are located in different positions.

Objects of the present disclosure are not limited to the above-mentioned object, and other objects, which are not mentioned above, can be clearly understood by those skilled in the art from the following descriptions.

In accordance with an aspect of the present disclosure, the above and other objects can be accomplished by the provision of a thin film transistor substrate comprising a substrate; a first thin film transistor disposed on the substrate and including a first gate electrode, a first active layer, a first source electrode, and a first drain electrode; a second thin film transistor disposed on the substrate and including a second gate electrode, a second active layer disposed on a different layer as the first active layer, a second source electrode, a second drain electrode, a first conductive layer disposed between the second active layer and the second source electrode, and a second conductive layer disposed between the second active layer and the second drain electrode; and a capacitor electrode including a first layer and a second layer disposed on the first layer, wherein the first layer of the capacitor electrode is on a same layer as the second active layer, and the second layer of the capacitor electrode is on a same layer as the first conductive layer.

In accordance with an aspect of the present disclosure, a thin film transistor substrate comprising a substrate; a first thin film transistor disposed on the substrate, including a first gate electrode, a first active layer, a first source electrode, and a first drain electrode; and a second thin film transistor disposed on the substrate, including a second gate electrode, a second active layer on a different layer from the first active layer, a second source electrode, a second drain electrode, a first conductive layer disposed between the second active layer and the second source electrode, and a second conductive layer disposed between the second active layer and the second drain electrode, wherein the first gate electrode includes a first layer and a second layer disposed on the first layer, and the first layer of the first gate electrode is disposed on a same layer as the second active layer or contains a same material as the second active layer, and the second layer of the first gate electrode is disposed on a same layer as the first conductive layer or contains a same material as the first conductive layer.

In accordance with an aspect of the present disclosure, provides a display apparatus comprising the aforementioned thin film transistor substrate, the first electrode provided on the thin film transistor substrate, the light emitting layer provided on the first electrode, and the second electrode provided on the light emitting layer.

According to the present disclosure, it is possible to prevent some thin film transistor properties from being degraded by dopant doping when multiple active layers are located in different positions.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1A:
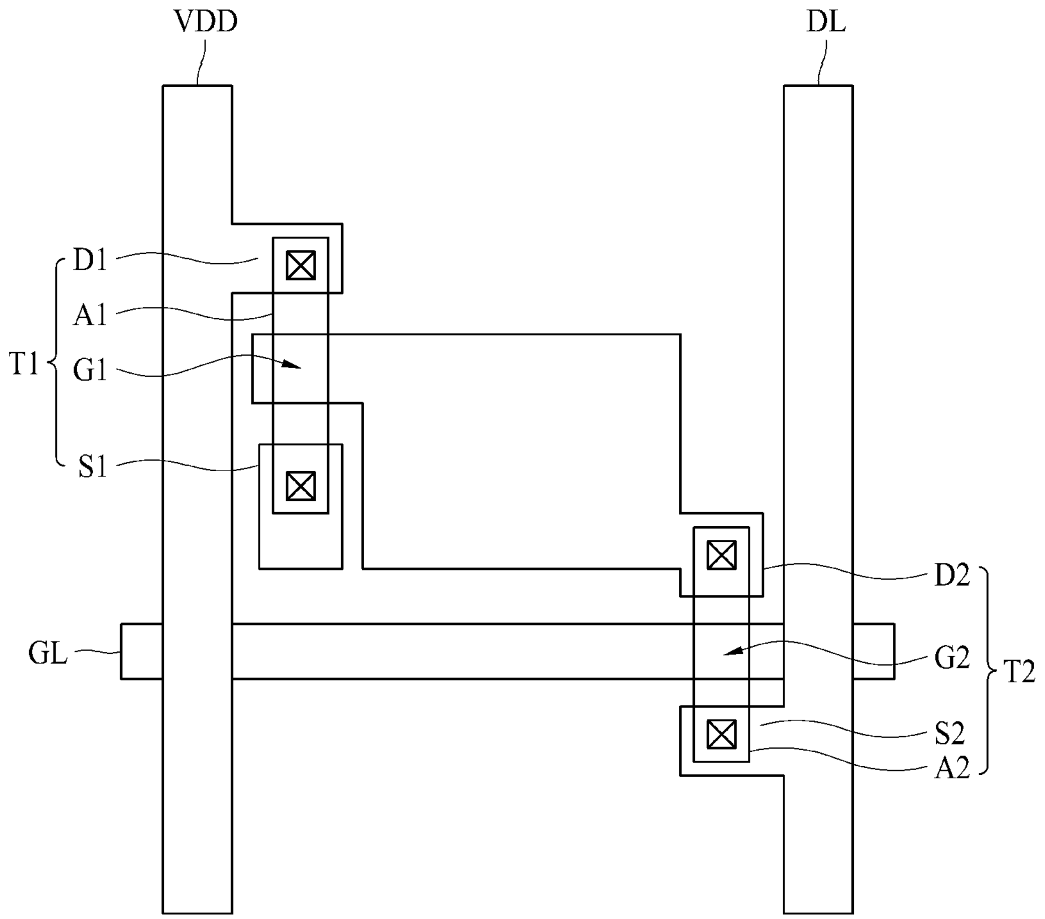
FIG. 1A is a plan view of a display apparatus according to an exemplary embodiment of the present disclosure.

Advantages and features of the present disclosure, and implementation methods thereof will be clarified through the following embodiments, which are described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, dimensions sizes, ratios, angles, numbers and the like disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which “comprise”, “comprising”, “contain”, “constitute”, “have” and “include” described in the present specification are used, another part may also be present unless “only”, “merely” or the like is used. The terms in a singular form may include plural forms unless noted to the contrary.

In construing an element, the element is construed as including an error or a tolerance region although there is no explicit description thereof.

In describing a positional relationship, for example, when the positional order is described as “on”, “above”, “below”, “over”, “under”, “beneath”, “beside”, “close to”, “adjacent to”, “near”, “next to” or the like, the case of no contact therebetween may be included, unless “just”, “close(ly)”, “immediate(ly)”, “direct(ly)” or the like is used.

If it is mentioned that a first element is positioned “on” a second element, it does not mean that the first element is essentially positioned above the second element in the figure. The upper part and the lower part of an object concerned may be changed depending on the orientation of the object. Consequently, the case in which a first element is positioned “on” a second element includes the case in which the first element is positioned “below” the second element as well as the case in which the first element is positioned “above” the second element in the figure or in an actual configuration.

In describing a temporal relationship, for example, when the temporal order is described as “after”, “subsequent”, “next”, and “before” a case which is not continuous may be included, unless “just”, “immediate(ly)”, “direct” or the like is used.

It will be understood that, although the terms “first”, “second”, “A”, “B”, “(a)” and “(b)” etc. may be used herein to describe various elements, these elements should not be limited by these terms. These terms are only used to distinguish one element from another. For example, a first element could be termed a second element, and, similarly, a second element could be termed a first element.

It should be understood that the term “at least one” includes all combinations related with any one item. For example, “at least one among a first element, a second element and a third element” may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

FIG. 1A is a plan view of a display apparatus according to an embodiment of the present disclosure, which shows the appearance of the first thin film transistor T1 and the second thin film transistor T2 provided in one pixel. The number of transistors included in a display apparatus is not limited to two, and may be any integer larger than two.

As shown in FIG. 1A, a display apparatus according to an embodiment of the present disclosure may include, without limitation, a gate line GL, a data line DL, a power line VDD, a first thin film transistor T1, and a second thin film transistor T2.

The gate line GL extends in a first direction, for example, in a horizontal direction.

The data line DL and the power line VDD extend in a second direction, for example, in a vertical direction, and are spaced apart from each other.

The first thin film transistor T1 can function as a driving thin film transistor and includes a first gate electrode G1, a first active layer A1, a first source electrode S1, and a first drain electrode D1.

The first gate electrode G1 is electrically connected to a second drain electrode D2 of the second thin film transistor T2. The first gate electrode G1 may be integrally formed with the second drain electrode D2, but is not limited thereto, and may as well be formed separately from the second drain electrode D2.

The first active layer A1 overlaps the first gate electrode G1 in its central area, and overlaps the first source electrode S1 and the first drain electrode D1 in both end areas of the first active layer A1, but is not limited thereto. For example, the first active layer A1 may overlap the first gate electrode G1 in any area thereof except end areas. Although not illustrated, a light blocking layer may be additionally formed to prevent or reduce light from entering the first active layer A1 by overlapping a partial region or the entire region of the first active layer A1.

The first source electrode S1 and the first drain electrode D1 are formed to face each other. The first source electrode S1 is electrically connected to an anode electrode (not shown), and the first drain electrode D1 is electrically connected to the power line VDD. In some cases, the first source electrode S1 may be electrically connected to the power line VDD, and the first drain electrode D1 may be electrically connected to the anode electrode (not shown).

The second thin film transistor T2 can function as a switching thin film transistor and includes a second gate electrode G2, a second active layer A2, a second source electrode S2, and a second drain electrode D2.

The second gate electrode G2 may be formed as a portion of the gate line GL, but is not limited thereto, and may protrude from the gate line GL.

The second active layer A2 overlaps the second gate electrode G2 in its central area, and overlaps the second source electrode S2 and the second drain electrode D2 in both end areas of the second active layer A2, but is not limited thereto. For example, the second active layer A2 may overlap the second gate electrode G2 in any area thereof except end areas.

The second source electrode S2 and the second drain electrode D2 are formed to face each other. The second source electrode S2 may protrude from the data line DL, but is not limited thereto and may be formed as a portion of the data line DL.

The second drain electrode D2 may be electrically connected to the first gate electrode G1 of the first thin film transistor T1.

Alternatively, the second drain electrode D2 protrude from the data line DL or may be formed as a portion of the data line DL. The second source electrode S2 may be electrically connected to the first gate electrode G1 of the first thin film transistor T1.

Figure 1B:
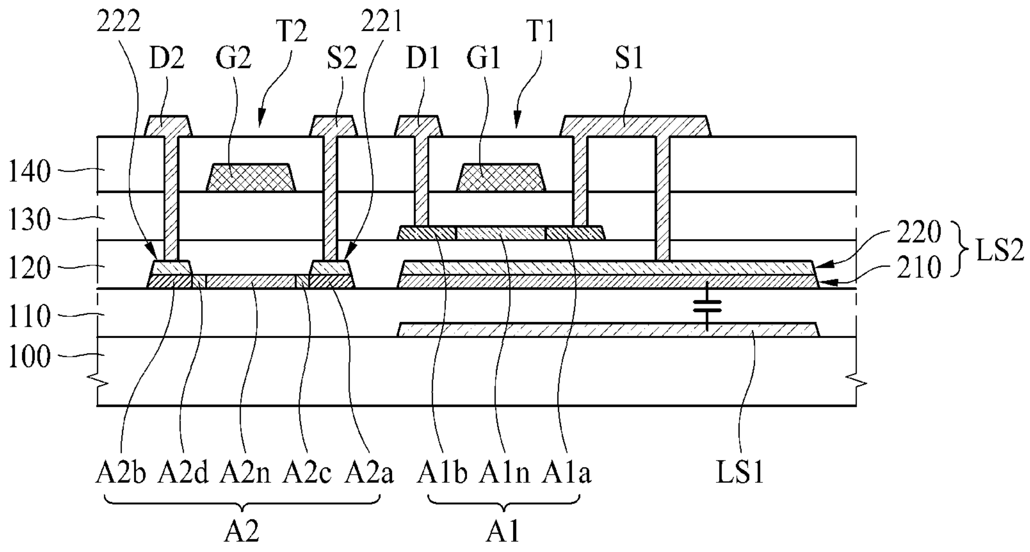
FIG. 1B is a cross-sectional view of a thin film transistor substrate according to an exemplary embodiment of the present disclosure.

FIG. 1B is a cross-sectional view of a thin film transistor substrate according to an embodiment of the present disclosure.

As shown in FIG. 1B, the thin film transistor substrate according to an embodiment of present disclosure may include a substrate 100, a first thin film transistor T1, a second thin film transistor T2, a first light blocking layer LS1, a second light blocking layer LS2, a buffer layer 110, a first gate insulating layer 120, a second gate insulating layer 130, and an interlayer insulating layer 140, but is not limited thereto. The thin film transistor substrate may include more layers, or some of the layers shown in FIG. 1B may be omitted or incorporated into other layers.

The substrate 100 may be made of glass or plastic. In particular, the substrate 100 may be made of transparent plastic having flexible characteristics, for example, polyimide, polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, and polystyrene (PS), which are only examples and is not necessarily limited thereto. When polyimide is used as the substrate 100, heat-resistant polyimide that can withstand high temperatures may be used considering that a high-temperature deposition process is performed on the substrate 100.

The first thin film transistor T1 includes a first active layer A1, a first gate electrode G1, a first source electrode S1, and a first drain electrode D1. In this case, the first gate electrode G1 is provided above the first active layer A1, and accordingly, the first thin film transistor T1 forms a top gate structure. Alternatively, the first thin film transistor T1 may form a bottom gate structure.

The first active layer A1 is provided on the first gate insulating layer 120.

The first active layer A1 may include a channel part A1*n*, a first connection part Ala, and a second connection part A1*b*.

The channel part A1*n* is made of a semiconductor material, and may overlap the first gate electrode G1 to be protected by the first gate electrode G1. The channel part A1*n* may include an oxide semiconductor material. The oxide semiconductor material is, for example, an IZO (indium zinc oxide)-based oxide semiconductor material, an IGO (indium gallium oxide)-based oxide semiconductor material, an ITO (indium tin oxide)-based oxide semiconductor material, an IGZO (indium gallium zinc oxide)-based oxide semiconductor material, an IGZTO (indium gallium zinc tin oxide)-based oxide semiconductor material, a GZO (gallium zinc oxide)-based oxide semiconductor material, a ITZO (indium tin zinc oxide)-based oxide material, a IGTO (indium gallium tin oxide)-based oxide semiconductor material, a ZnO (zinc oxide)-based oxide semiconductor material, a ZTO (zinc-tin oxide)-based oxide semiconductor material, a ZIO (zinc-indium oxide)-based oxide semiconductor material, a InO (indium oxide)-based oxide semiconductor material, a TiO (titanium oxide)-based oxide semiconductor material and a FIZO (Fe indium zinc oxide)-based oxide semiconductor material., but is not limited thereto.

The first connection part Ala may be connected to one side of the channel part Aln, and the second connection part A1*b* may be connected to another side of the channel part A1*n*. The first connection part Ala and the second connection part A1*b* may not overlap the first gate electrode G1. The first connection part Ala and the second connection part A1*b* have excellent conductivity compared to the channel part A1*n*, and each may serve as a wiring or source or drain electrode.

The first connection part Ala and the second connection part A1*b* may become conductive by doping a dopant to a semiconductor material constituting the channel part Aln by, for example, an ion doping process using the first gate electrode G1 as a mask. On the other hand, although not illustrated, the second gate insulating layer 130 may be patterned using the first gate electrode G1 as a mask, and in this case, when the second gate insulating layer 130 is patterned by, for example, a dry etching process, the first connection part Ala and the second connection part A1*b* may be exposed to plasma and become conductive.

The first gate electrode G1 is provided on the second gate insulating layer 130. The first gate electrode G1 may overlap the channel part A1*n*, and may not overlap the first connection part Ala and the second connection part A1*b*. The first gate electrode G1 may be formed of a conductive material, for example, copper Cu, aluminum Al, molybdenum Mo, nickel Ni, titanium Ti, chromium Cr, or an alloy thereof, but not limited thereto.

The first source electrode S1 and the first drain electrode D1 are provided on the interlayer insulating layer 140. The first source electrode S1 may be connected to the first connection part Ala through a contact hole provided in the second gate insulating layer 130 and the interlayer insulating layer 140. In addition, the first source electrode S1 may be connected to the second light blocking layer LS2 through a contact hole provided in the first gate insulating layer 120, the second gate insulating layer 130, and the interlayer insulating layer 140. The first drain electrode D1 may be connected to the second connection part A1*b* through a contact hole provided in the second gate insulating layer 130 and the interlayer insulating layer 140. The first source electrode S1 and the first drain electrode D1 may be formed of a conductive material, for example, copper Cu, aluminum Al, molybdenum Mo, nickel Ni, titanium Ti, chromium Cr, or an alloy thereof, but not limited thereto.

The second thin film transistor T2 includes a second active layer A2, a second gate electrode G2, a second source electrode S2, and a second drain electrode D2. In this case, the second gate electrode G2 is provided above the second active layer A2, and accordingly, the second thin film transistor T2 forms a top gate structure. Alternatively, the second thin film transistor T2 may form a bottom gate structure.

The second active layer A2 is provided on the buffer layer 110. The second active layer A2 may be provided on a different layer from the first active layer A1, for example, below the first active layer A1, and may be provided on the same layer as the second light blocking layer LS2.

The second active layer A2 may include a channel part A2*n*, a first connection part A2*a*, a second connection part A2*b*, a first intermediate part A2*c*, and a second intermediate part A2*d*.

The channel part A2*n* is made of a semiconductor material, and may overlap the second gate electrode G2 to be protected by the second gate electrode G2. The channel part A2*n* may include an oxide semiconductor material. The oxide semiconductor material is, for example, an IZO (indium zinc oxide)-based oxide semiconductor material, an IGO (indium gallium oxide)-based oxide semiconductor material, an ITO (indium tin oxide)-based oxide semiconductor material, an IGZO (indium gallium zinc oxide)-based oxide semiconductor material, an IGZTO (indium gallium zinc tin oxide)-based oxide semiconductor material, a GZO (gallium zinc oxide)-based oxide semiconductor material, a ITZO (indium tin zinc oxide)-based oxide material, a IGTO (indium gallium tin oxide)-based oxide semiconductor material, a ZnO (zinc oxide)-based oxide semiconductor material, a ZTO (zinc-tin oxide)-based oxide semiconductor material, a ZIO (zinc-indium oxide)-based oxide semiconductor material, a InO (indium oxide)-based oxide semiconductor material, a TiO (titanium oxide)-based oxide semiconductor material and a FIZO (Fe indium zinc oxide)-based oxide semiconductor material., but is not limited thereto. The channel part A2*n* of the second active layer A2 may include an oxide semiconductor material different from the channel part A1*n* of the first active layer A1, Alternatively, the channel part A2*n* of the second active layer A2 may include the same material as the channel part A1*n* of the first active layer A1.

The first connection part A2*a* may be provided on one side of the channel part A2*n*, and the second connection part A2*b* may be provided on another side of the channel part A2*n*. The first connection part A2*a* and the second connection part A2*b* may not overlap the second gate electrode G2. The first connection part A2*a* and the second connection part A2*b* may be formed of the same or different material as the channel part A2*n*.

A first conductive layer 221 is formed on an upper surface of the first connection part A2*a*. In particular, the upper surface of the first connection part A2*a* is in contact with a lower surface of the first conductive layer 221. A second conductive layer 222 is formed on an upper surface of the second connection part A2*b*. In particular, the upper surface of the second connection part A2*b* is in contact with a lower surface of the second conductive layer 222. The first conductive layer 221 and the second conductive layer 222 may be formed of the same material, for example, the same metal such as Al, Ag, Cu, Pb, Mo, and Ti, or an alloy thereof or metal oxide such as indium-tin-oxide (ITO) or indium-zinc-oxide (IZO).

As described above, according to an embodiment of present disclosure, since the first conductive layer 221 is formed on the upper surface of the first connection part A2*a* and the second conductive layer 222 are formed on the upper surface of the second connection part A2*b*, dopants may not be doped in the first connection part A2*a* and the second connection part A2*b*.

The first intermediate part A2*c* is provided between the channel part A2*n* and the first connection part A2*a*. Specifically, one side of the first intermediate part A2*c* is connected to the channel part A2*n*, and another side of the first intermediate part A2*c* is connected to the first connection part A2*a*. The first intermediate part A2*c* may overlap a region between the second gate electrode G2 and the first conductive layer 221, and thus a dopant may be doped on the first intermediate part A2*c* through the region therebetween.

The second intermediate part A2*d* is provided between the channel part A2*n* and the second connection part A2*b*. Specifically, one side of the second intermediate part A2*d* is connected to the channel part A2*n*, and another side of the second intermediate part A2*d* is connected to the second connection part A2*b*. The second intermediate part A2*d* may overlap a region between the second gate electrode G2 and the second conductive layer 222 in a horizontal direction, and thus a dopant may be doped on the second intermediate part A2*d* through the region between the second gate electrode G2 and the second conductive layer 222 in the horizontal direction.

The first intermediate part A2*c* and the second intermediate part A2*d* may be made conductive by doping a dopant to a semiconductor material constituting the channel part A2*n* by, for example, an ion doping process using the second gate electrode G2, the first conductive layer 221, and the second conductive layer 222 as a mask. Alternatively, although not illustrated, the second gate insulating layer 130 may be patterned using the second gate electrode G2 as a mask, and when the second gate insulating layer 130 is patterned by, for example, a dry etching process, the first intermediate part A2*c* and the second intermediate part A2*d* may be exposed to plasma and become conductive.

On the other hand, if one end of the first conductive layer 221, for example, the left end coincides with one end of the second gate electrode G2, for example, the right end, or one end of the first conductive layer 221, for example, the left end overlaps the second gate electrode G2, the first intermediate part A2*c* may not be formed.

Similarly, when one end of the second conductive layer 222, for example, the right end, coincides with another end of the second gate electrode G2, for example, the left end, or one end of the second conductive layer 222, for example, the right end overlaps the second gate electrode G2, the second intermediate part A2*d* may not be formed.

The second gate electrode G2 is provided on the second gate insulating layer 130. The second gate electrode G2 may overlap the channel part A2*n*, and may not overlap the first connection part A2*a*, the second connection part A2*b*, the first intermediate part A2*c*, and the second intermediate part A2*d*.

The second gate electrode G2 may be made of the same material on the same layer as the first gate electrode G1. Since the second active layer A2 is provided below the first active layer A1 in a manner of not overlapping with each other, a distance from the second gate electrode G2 to the second active layer A2 is greater than a distance from the first gate electrode G1 to the first active layer A1.

The second source electrode S2 and the second drain electrode D2 are provided on the interlayer insulating layer 140 which acts as a barrier for preventing unwanted electrical conduction between different layers, thereby promoting the device's performance and reliability. The second source electrode S2 may be connected to the first conductive layer 221 through a contact hole provided in the first gate insulating layer 120, the second gate insulating layer 130, and the interlayer insulating layer 140, and thus may be electrically connected to the first connection part A2*a*. The second drain electrode D2 may be connected to the second conductive layer 222 through a contact hole provided in the first gate insulating layer 120, the second gate insulating layer 130, and the interlayer insulating layer 140, and thus may be electrically connected to the second connection part A2*b*. Herein, the contact hole is a strategically positioned open that allows for electrical connection between layers, while the insulating layers ensure that this connection is isolated from other parts of the device. As a result of this arrangement, the second source electrode S2 can be electrically connected to the first connection part A2*a*, and the second drain electrode D2 can be electrically connected to the second connection part A2*b*.

The second source electrode S2 and the second drain electrode D2 may be made of the same material on the same layer as the first source electrode S1 and the first drain electrode D1.

The first light blocking layer LS1 is formed on the substrate 100. The first light blocking layer LS1 may be formed to overlap the first active layer A1, thereby preventing external light from entering the first active layer A1. The first light blocking layer LS1 may be formed to overlap the entire first active layer A1. That is, the first light blocking layer LS1 is a component designed to prevent external light from interfering with the operation of the first active layer (A1). It does so by overlapping the entire first active layer A1, serving as a physical barrier that blocks light intrusion. Although not shown, the first light blocking layer LS1 may be electrically connected to the first gate electrode G1. Accordingly, the first light blocking layer LS1 is made of a conductive material such as Al, Ag, Cu, Pb, Mo, Ti, or an alloy thereof or indium-tin-oxide (ITO) or indium-zinc-oxide (IZO) and may function as a capacitor electrode. Specifically, the first light blocking layer LS1 electrically connected to the first gate electrode G1 may function as one capacitor electrode, and the second light blocking layer LS2 electrically connected to the first source electrode S1 may function as another capacitor electrode, so that a capacitor may be configured by the first light blocking layer LS1, the second light blocking layer LS2, and the buffer layer 110.

The second light blocking layer LS2 is formed on the buffer layer 110 and may be formed to at least partially overlap the first light blocking layer LS1 above the first light blocking layer LS1.

The second light blocking layer LS2 is formed to at least partially overlap the first active layer A1, thereby preventing external light from entering the first active layer A1. The second light blocking layer LS2 may be formed to overlap the entire first active layer A1. The second light blocking layer LS2 may be electrically connected to the first source electrode S1 and may function as a capacitor electrode. Alternatively, the second light blocking layer LS2 may be electrically connected to the first gate electrode G1 and may function as a capacitor electrode, and the first light blocking layer LS1 may be electrically connected to the first source electrode S1 and may function as another capacitor electrode.

The second light blocking layer LS2 may be formed on the same layer as the second active layer A2. The second light blocking layer LS2 may include a first layer 210 and a second layer 220. The first layer 210 is formed on the buffer layer 110, and the second layer 220 is formed on the first layer 210. The first layer 210 and the second layer 220 may have the same pattern. The first layer 210 is made of the same material as the first connection part A2*a* or the second connection part A2*b* of the second active layer A2, and the second layer 220 is made of the same material as the first conductive layer 221 or the second conductive layer 222. Therefore, the first layer 210, the first connection part A2*a*, and the second connection part A2*b* are formed simultaneously through the same process, and the second layer 220, the first conductive layer 221, and the second conductive layer 222 are formed simultaneously through the same process.

The buffer layer 110 is formed between the substrate 100 and the second active layer A2, and between the first light blocking layer LS1 and the second light blocking layer LS2. The buffer layer 110 may protect the second active layer A2 and other layers by blocking foreign matters such as air and moisture. The buffer layer 110 may be made of an inorganic insulating material such as silicon oxide, silicon nitride, silicon oxynitride, or metal oxide such as IGZO, but is not limited thereto and may be made of an organic insulating material such as acrylic resin, epoxy resin, polyimide, polyethylene, silicon oxycarbon (SiOC), or the like. The buffer layer 110 may be formed of a single layer or may be formed of a plurality of layers.

The first gate insulating layer 120 is formed between the first active layer A1 and the second light blocking layer LS2, and the second gate insulating layer 130 is formed between the first active layer A1 and the first gate electrode G1. In addition, the first gate insulating layer 120 and the second gate insulating layer 130 are formed between the second active layer A2 and the second gate electrode G2. Each of the first gate insulating layer 120 and the second gate insulating layer 130 may be made of an inorganic insulating material such as silicon oxide, silicon nitride, or metal oxide, but is not limited thereto. Each of the first gate insulating layer 120 and the second gate insulating layer 130 may be formed of a single layer or may be formed of a plurality of layers.

The interlayer insulating layer 140 is formed between the first gate electrode G1 and the first source/drain electrode S1/D1, and between the second gate electrode G2 and the second source/drain electrode S2/D2. The interlayer insulating layer 140 may be made of an inorganic insulating material such as silicon oxide, silicon nitride, silicon oxynitride, or metal oxide such as IGZO, but is not limited thereto and may be made of an organic insulating material such as acrylic resin, epoxy resin, polyimide, polyethylene, silicon oxycarbon (SiOC), or the like. The interlayer insulating layer 140 may be formed of a single layer or may be formed of a plurality of layers.

According to an embodiment of present disclosure, since the first conductive layer 221 and the second conductive layer 222 are formed on the second active layer A2, there is no need for a conduction process such as an ion doping process for the first connection part A2*a* and the second connection part A2*b* of the first active layer A1. Therefore, even if the first active layer A1 and the second active layer A2 are provided at different positions, the characteristic uniformity between the first active layer A1 and the second active layer A2 does not decrease due to the difference in the movement path of doped ions.

In addition, according to an embodiment of present disclosure, since the second active layer A2 is formed by the same process as the first layer 210 of the second light blocking layer LS2, and the first conductive layer 221 and the second conductive layer 222 are formed by the same process as the second layer 220 of the second light blocking layer LS2, a separate process for forming the second light blocking layer LS2 is not required, and thus the process may be simply optimized.

In addition, according to an embodiment of present disclosure, the first thin film transistor T1 may have an S-factor larger than the second thin film transistor T2, which is described as follows.

The S (sub-threshold swing)-factor can be used as an indicator of the degree of change in the drain-source current IDS to the gate voltage VGS in the threshold voltage Vth section of the thin film transistors T1, T2.

Such an S-factor is obtained as the reciprocal value of the slope of the graph in the threshold voltage Vth section in the drain-source current graph for the gate voltage of the thin film transistors T1, T2. Therefore, when the S-factor increases, the drain-source current change rate for the gate voltage becomes gentle in the threshold voltage Vth section, and when the S-factor decreases, the drain-source current change rate for the gate voltage increases rapidly in the threshold voltage Vth section. In other words, if the slope of the drain-source current graph is large, the S-factor is small, and if the slope of the drain-source current graph is small, the S-factor is large.

When the S-factor increases, the change rate of the drain-source current to the gate voltage in the threshold voltage Vth section becomes gentle, so it becomes easy to adjust the magnitude of the drain-source current through the adjustment of the gate voltage. In a display apparatus driven by current, for example, an organic light emitting display apparatus, the gradation of a pixel can be controlled by adjusting the magnitude of the drain-source current of the driving thin film transistor. In this case, the magnitude of the drain-source current of the driving thin film transistor is determined by the gate voltage. Therefore, in an organic light emitting display apparatus driven by current, the larger the S-factor of the driving thin film transistor driving TFT, the easier it is to adjust the gray scale of the pixel.

According to an embodiment of present disclosure, since the second light blocking layer LS2 connected to the first source electrode S1 overlaps the first active layer A1, when the same voltage as that of the first source electrode S1 is applied to the second light blocking layer LS2, the second light blocking layer LS2 may have an electrical effect on the first active layer A1. Due to the electrical effect of the second light blocking layer LS2, the electric field applied to the first active layer A1 may be reduced by the first gate electrode G1. As a result, the S-factor of the first thin film transistor T1 including the second light blocking layer LS2 may be larger than the S-factor of the second thin film transistor T2 that does not include the light blocking layer. Therefore, the first thin film transistor T1 may be easily used as a driving thin film transistor, and the second thin film transistor T2 may be easily used as a switching thin film transistor.

The first thin film transistor T1 may comprise a driving transistor provided in each of a plurality of pixels in a display area displaying an image.

The second thin film transistor T2 may comprise a switching transistor provided in each of a plurality of pixels in a display area displaying an image. In addition, the second thin film transistor T2 may comprise a switching transistor provided in a non-display area outside the display area, in particular, a circuit area for example, a GIP area.

In addition, although not illustrated, a third thin film transistor having the same structure as the first thin film transistor T1 including the first active layer A1, the first gate electrode G1, the first source electrode S1, and the first drain electrode D1 each of which being not connected to the first light blocking layer LS1 and the second light blocking layer LS2, may be additionally included. In this way, the third thin film transistor that is not connected to the first light blocking layer LS1 and the second light blocking layer LS2 may comprise a switching transistor provided in the display area or the non-display area, which is the same in the following embodiment.

In the following embodiments, the same drawing code is given to the same configuration as FIG. 1B, and the repeated description of the same configuration will be omitted.

Figure 2:
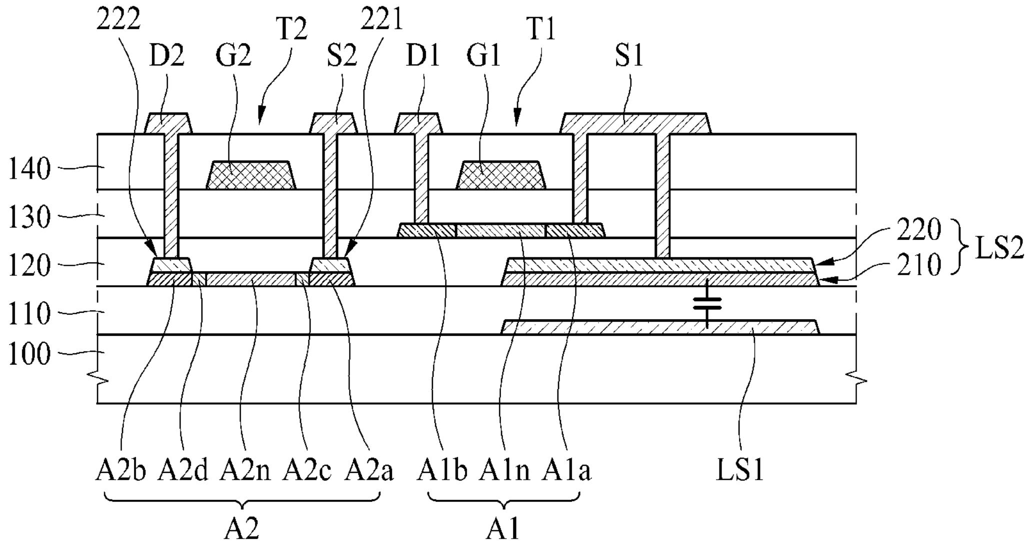
FIG. 2 is a cross-sectional view of a thin film transistor substrate according to another exemplary embodiment of the present disclosure.

FIG. 2 is a cross-sectional view of a thin film transistor substrate according to another embodiment of the present disclosure. FIG. 2 is the same as FIG. 1B, except that the structure of the first light blocking layer LS1 and the second light blocking layer LS2 has been changed.

Referring to FIG. 2, the first light blocking layer LS1 and the second light blocking layer LS2 are provided to overlap with portion of the first active layer A1 without overlapping with the entire first active layer A1.

Specifically, the second light blocking layer LS2 is overlapped with the first connection part Ala of the first active layer A1, but is not overlapped with the second connection part A1*b* of the first active layer A1. In this case, an effective gate voltage VEFF applied to the first connection part Ala may be smaller than an effective gate voltage VEFF applied to the second connection part A1*b*, and accordingly, the S-factor of the first thin film transistor T1 may be increased.

On the other hand, in the structure of FIG. 2, since the effective gate voltage VEFF applied to the second connection part A1*b* is not reduced or reduced by a small amount, charge can move smoothly in the ON state of the first thin film transistor T1, so that the ON current of the first thin film transistor T1 is not reduced.

In the conventional case, a method of increasing the distance between the gate electrode and the channel part was applied to increase the S-factor of the thin film transistor. in this case, there is a problem that the S-factor increases but the ON current of the thin film transistor decreases.

On the other hand, according to another embodiment of the present disclosure, the second light blocking layer LS2 made of a conductive material is overlapped with the first connection part Ala of the first active layer A1, so that the S-factor on the first thin film transistor T1 may be increased, and the ON current of the first thin film transistor T1 does not decrease by preventing the second light blocking layer LS2 from overlapping with the second connection part A1*b* of the first active layer A1.

Figure 3:
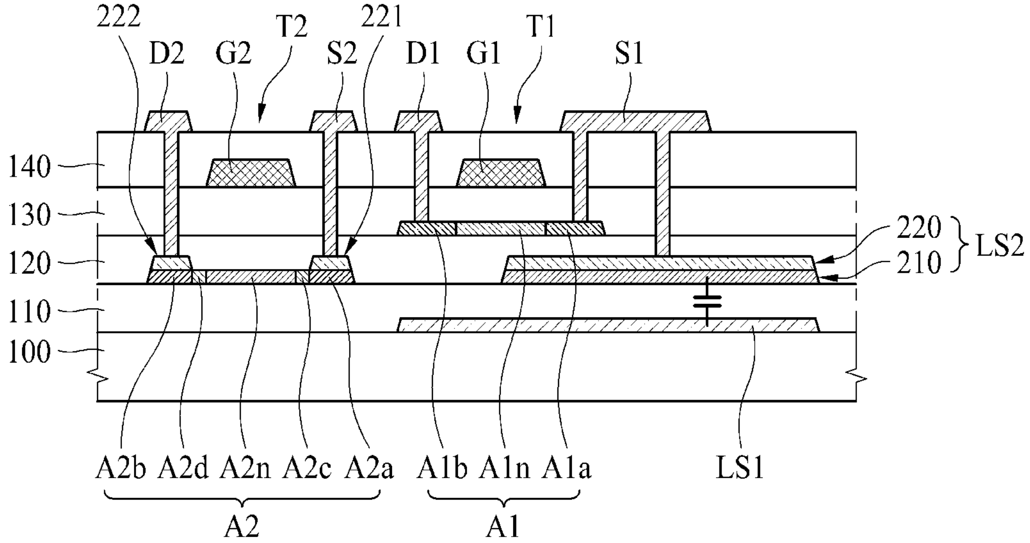
FIG. 3 is a cross-sectional view of a thin film transistor substrate according to another exemplary embodiment of the present disclosure.

FIG. 3 is a cross-sectional view of a thin film transistor substrate according to another embodiment of the present disclosure. FIG. 3 is the same as FIG. 2 described above, except that the structure of the first light blocking layer LS1 has been changed.

Referring to FIG. 3, the second light blocking layer LS2 is provided to overlap with a portion of the first active layer A1 without overlapping with the entire first active layer A1. Accordingly, as shown in FIG. 2 described above, the S-factor of the first thin film transistor T1 is increased, and the on current is not decreased.

On the other hand, the first light blocking layer LS1 is provided to overlap with the entire first active layer A1. In this way, since the first light blocking layer LS1 overlaps with the entire first active layer A1, the external light may be blocked from entering the first active layer A1 by the first light blocking layer LS1.

Figure 4:
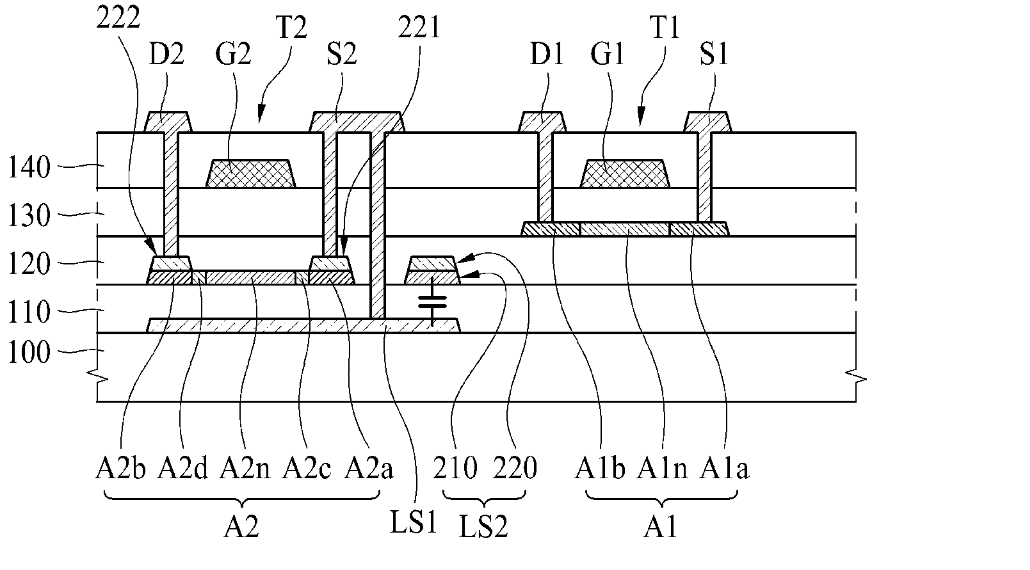
FIG. 4 is a cross-sectional view of a thin film transistor substrate according to another exemplary embodiment of the present disclosure.

FIG. 4 is a cross-sectional view of a thin film transistor substrate according to another embodiment of the present disclosure. FIG. 4 is different from FIG. 1B in that the position of the first light blocking layer LS1 is changed, the second light blocking layer LS2 is omitted, and the capacitor electrode C was added.

As shown in FIG. 4, the first light blocking layer LS1 and the second light blocking layer LS2 are not provided under the first thin film transistor T1, and the first light blocking layer LS1 is provided under the second thin film transistor T2.

The first light blocking layer LS1 is formed on the substrate 100 and may be formed to overlap the second active layer A2 below the second active layer A2. As illustrated, the first light blocking layer LS1 may be formed to be overlapped with an entire the second active layer A2, but is not necessarily limited to, and may be formed to be overlapped with a portion of the second active layer A2. Specifically, the first light blocking layer LS1 may overlap the first connection part A2*a* of the second active layer A2 and may not overlap the second connection part A2*b* of the second active layer A2.

In addition, the first light blocking layer LS1 is connected to the second source electrode S2. Specifically, the second source electrode S2 is electrically connected to the first light blocking layer LS1 through a contact hole provided in the buffer layer 110, the first gate insulating layer 120, the second gate insulating layer 130, and interlayer insulating layer 140. In this way, since the first light blocking layer LS1 is connected to the second source electrode S2, the first light blocking layer LS1 may function as one electrode of the capacitor. In addition, the S-factor of the second thin film transistor T2 is larger than the S-factor of the first thin film transistor T1 by the first light blocking layer LS1. Therefore, the second thin film transistor T2 may be used as a driving transistor, and the first thin film transistor T1 may be used as a switching transistor.

The capacitor electrode C may be formed on the same layer as the second active layer A2. Although not specifically shown, the capacitor electrode C may be electrically connected to the second gate electrode G2. Alternatively, the first light blocking layer LS1 may be connected to the second gate electrode G2, and the capacitor electrode C may be electrically connected to the second source electrode S2.

The capacitor electrode C may include a first layer 210 and a second layer 220. The first layer 210 is formed on the buffer layer 110, and the second layer 220 is formed on the first layer 210. The first layer 210 and the second layer 220 may be made of the same pattern as each other. The first layer 210 is made of the same material as the first connection part A2*a* or the second connection part A2*b* of the second active layer A2, and the second layer 220 is made of the same material as the first conductive layer 221 or the second conductive layer 222. Therefore, the first layer 210, the first connection part A2*a*, and the second connection part A2*b* are formed simultaneously through the same process, and the second layer 220, the first conductive layer 221, and the second conductive layer 222 are formed simultaneously through the same process.

According to another embodiment of present disclosure, since the second active layer A2 is formed of the same material as the first layer 210 of the capacitor electrode C through the same process. And the first conductive layer 221 and the second conductive layer 222 is formed of the same material as the second layer 220 of the capacitor electrode C through the same process, a separate process for forming the capacitor electrode C is not required, and thus the process may be simply optimized.

Figure 5:
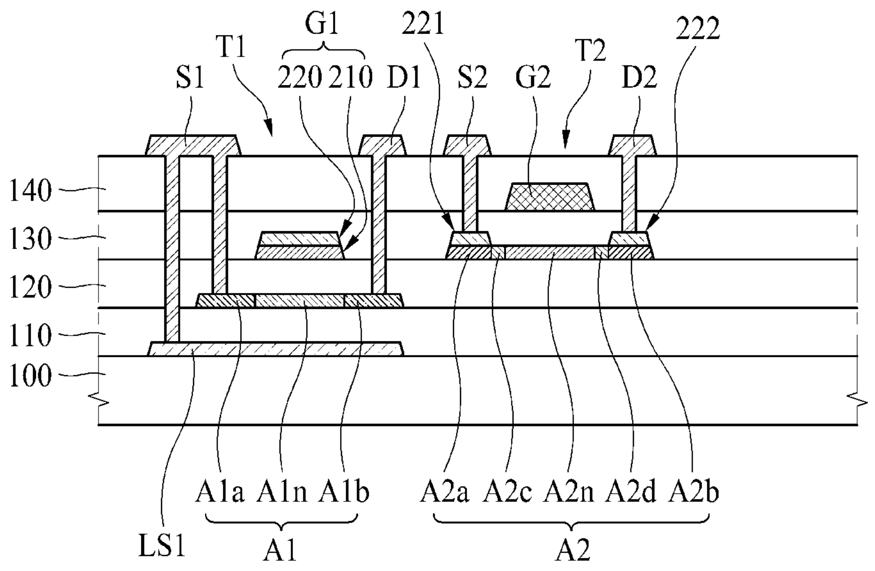
FIG. 5 is a cross-sectional view of a thin film transistor substrate according to another exemplary embodiment of the present disclosure.

FIG. 5 is a cross-sectional view of a thin film transistor substrate according to another embodiment of the present disclosure.

As shown in FIG. 5, a thin film transistor substrate according to an embodiment of the present disclosure includes the substrate 100, the first thin film transistor T1, the second thin film transistor T2, the first light blocking layer LS1, the buffer layer 110, the first gate insulating layer 120, the second gate insulating layer 130, and the interlayer insulating layer 140, but is not limited thereto. The thin film transistor substrate may include more layers, or some of the layers shown in FIG. 5 may be omitted or incorporated into other layers.

The first thin film transistor T1 may comprise a driving transistor, and the second thin film transistor T2 may comprise a switching transistor.

The first thin film transistor T1 comprises a first active layer A1, a first gate electrode G1, a first source electrode S1, and a first drain electrode D1.

The first active layer A1 is provided on the buffer layer 110. The first active layer A1 may include a channel part A1*n*, the first connection part Ala, and the second connection part A1*b*.

The first gate electrode G1 is provided on the first gate insulating layer 120.

The first gate electrode G1 may be formed on the same layer as the second active layer A2 of the second thin film transistor T2. The first gate electrode G1 may include a first layer 210 and a second layer 220. The first layer 210 is formed on the first gate insulating layer 120, and the second layer 220 is formed on the first layer 210. The first layer 210 and the second layer 220 may be formed of the same pattern as each other. The first layer 210 is formed of the same material as the first connection part A2*a* or the second connection part A2*b* of the second active layer A2, and the second layer 220 is formed of the same material as the first conductive layer 221 or the second conductive layer 222. Therefore, the first layer 210, the first connection part A2A, and the second connection part A2*b* are formed simultaneously through the same process, the second layer 220, the first conductive layer 221, and the second conductive layer 222 are formed simultaneously through the same process.

The first source electrode S1 and the first drain electrode D1 are provided on the interlayer insulating layer 140. The first source electrode S1 is connected to the first connection part Ala through a contact hole provided in the first gate insulating layer 120, the second gate insulating layer 130 and the interlayer insulating layer 140. In addition, the first source electrode S1 is connected to the first light blocking layer LS1 through a contact hole provided in the buffer layer 110, the first gate insulating layer 120, the second gate insulating layer 130 and the interlayer insulating layer 140. the first drain electrode D1 is connected to the second connection part A1*b* through a contact hole provided in the first gate insulating layer 120, the second gate insulating layer 130 and the interlayer insulating layer 140.

The second thin film transistor T2 includes a second active layer A2, a second gate electrode G2, a second source electrode S2, and a second drain electrode D2.

The second active layer A2 is provided on the first gate insulating layer 120. The second active layer A2 is provided above the first active layer A1 and may be provided on the same layer as the first gate electrode G1.

The second active layer A2 may include a channel part A2*n*, a first connection part A2*a*, a second connection part A2*b*, a first intermediate part A2*c*, a second intermediate part A2*d*.

The first conductive layer 221 is formed on an upper surface of the first connection part A2*a*, and the second conductive layer 222 is formed on an upper surface of the second connection part A2*b*.

The second gate electrode G2 is provided on the second gate insulating layer 130. The second gate electrode G2 may be provided on a different layer from the first gate layer G1, for example, above the first gate electrode G1.

The second source electrode S2 and the second drain electrode D2 are provided on the interlayer insulating layer 140. The second source electrode S2 may be connected to the first conductive layer 221 through a contact hole provided in the second gate insulating layer 130 and the interlayer insulating layer 140, and the second drain electrode D2 may be connected to the second conductive layer 222 through a contact hole provided in the second gate insulating layer 130 and the interlayer insulating layer 140.

The first light blocking layer LS1 is formed on the substrate 100. The first light blocking layer LS1 may be formed to at least partially overlap the first active layer A1 to prevent or reduce the external light from being incident into the first active layer A1. The first light blocking layer LS1 may be formed to overlap the entire first active layer A1. The first light blocking layer LS1 may be electrically connected to the first source electrode S1. Therefore, the first light blocking layer LS1 is made of a conductive material and may be functioned as a capacitor electrode. In addition, by the first light blocking layer LS1, the S-factor of the first thin film transistor TI is larger than the S-factor of the second thin film transistor T2. Thus, the second thin film transistor T2 may be used as a switching transistor, and the first thin film transistor TI may be used as a drive transistor.

The buffer layer 110 is formed between the first light blocking layer LS1 and the first active layer A1. The first gate insulating layer 120 is formed between the first active layer A1 and the first gate electrode G1. In addition, the buffer layer 110 and the first gate insulating layer 120 are formed between the substrate 100 and the second active layer A2. The second gate insulating layer 130 is formed between the second gate electrode G2 and the second active layer A2. The interlayer insulating layer 140 is formed between the second gate electrode G2 and the second source/drain electrode S2/D2. In addition, the second gate insulating layer 130 and the interlayer insulating layer 140 are formed between the first gate electrode G1 and the first source/drain electrode S1/D1.

According to another embodiment of the present disclosure, since the first connection part A2*a* or the second connection part A2*b* of the second active layer A2 is formed of the same material as the first layer 210 of the first gate electrode G1 by the same process, and the first conductive layer 221 and the second conductive layer 222 are formed of the same material as the second layer 220 of the first gate electrode G1 by the same process, a separate process for forming the first gate electrode G1 is not required, and thus the process may be simply optimized.

Figure 6:
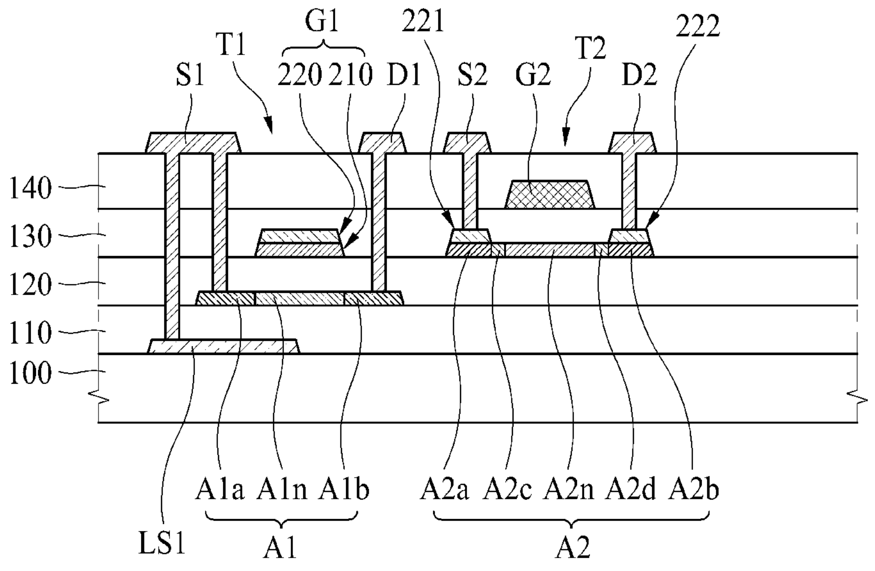
FIG. 6 is a cross-sectional view of a thin film transistor substrate according to another exemplary embodiment of the present disclosure.

FIG. 6 is a cross-sectional view of a thin film transistor substrate according to another embodiment of the present disclosure. FIG. 6 is the same as FIG. 5, except that the structure of the first light blocking layer LS1 has been changed.

Referring to FIG. 6, the first light blocking layer LS1 is provided to overlap with a portion of the first active layer A1 without overlapping with the entire first active layer A1. Specifically, the first light blocking layer LS1 is overlapped with the first connection part Ala of the first active layer A1, but is not overlapped with the second connection part Alb of the first active layer A1. Accordingly, the S-factor of the first thin film transistor T1 increases, and the on current is not reduced.

Figure 7:
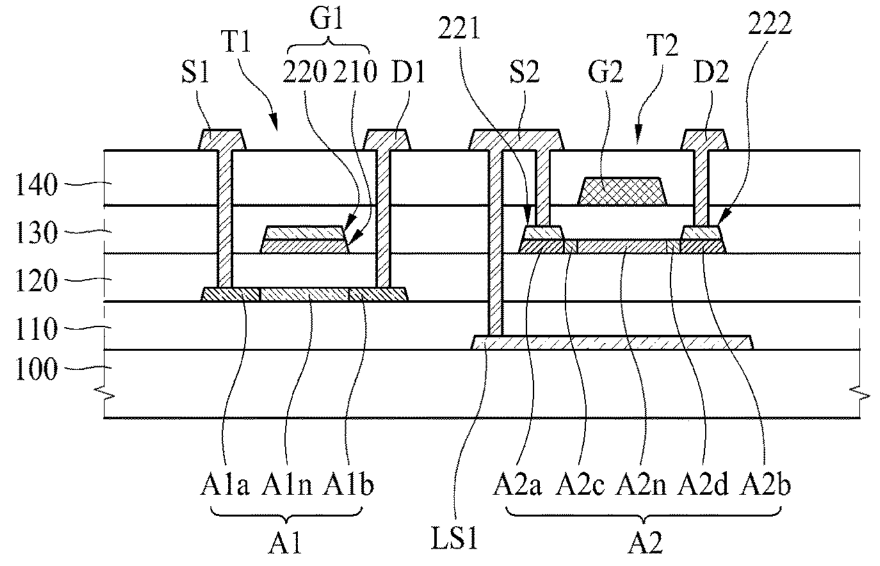
FIG. 7 is a cross-sectional view of a thin film transistor substrate according to another exemplary embodiment of the present disclosure.

FIG. 7 is a cross-sectional view of a thin film transistor substrate according to another embodiment of the present disclosure. FIG. 7 is different from FIG. 5 described above in that the position of the first light blocking layer LS1 has been changed.

As shown in FIG. 7, the first light blocking layer LS1 is not provided under the first thin film transistor T1, and the first light blocking layer LS1 is provided under the second thin film transistor T2.

The first light blocking layer LS1 is formed on the substrate 100 and may be formed to overlap the second active layer A2 below the second active layer A2. As illustrated, the first light blocking layer LS1 may be formed to be overlapped with the entire second active layer A2, but is not necessarily limited to, and a portion of the second active layer A2. Specifically, the first light blocking layer LS1 is overlapped with the first connection part A2*a* of the second active layer A2, but is not overlapped with the second connection part A2*b* of the second active layer A2.

In addition, the first light blocking layer LS1 is connected to the second source electrode S2. Specifically, the second source electrode S2 is electrically connected to the first light blocking layer LS1 through a contact hole provided in the buffer layer 110, the first gate insulating layer 120, the second gate insulating layer 130 and the interlayer insulating layer 140. In this way, the first light blocking layer LS1 is connected to the second source electrode S2, so that the first light blocking layer LS1 may function as one electrode of the capacitor. In addition, by the first light blocking layer LS1, the S-factor of the second thin film transistor T2 is larger than the S-factor of the first thin film transistor T1. Thus, the second thin film transistor T2 may be used as a drive transistor, and the first thin film transistor T1 may be used as a switching transistor.

Figure 8:
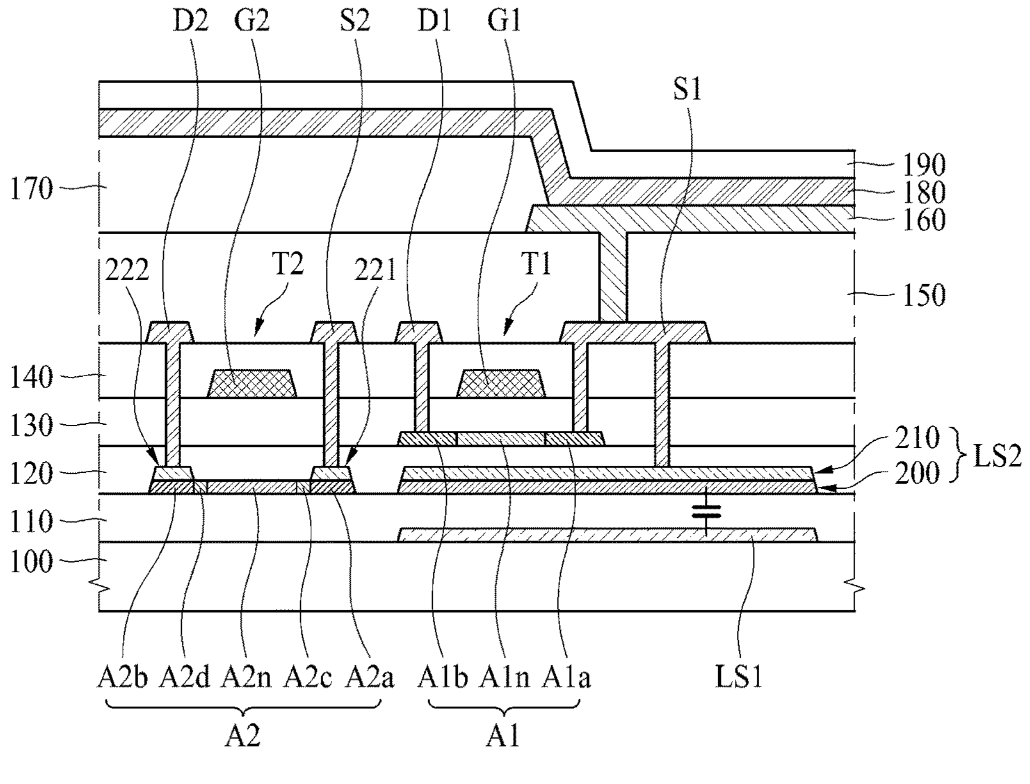
FIG. 8 is a cross-sectional view of a display apparatus according to an exemplary embodiment of the present disclosure.

FIG. 8 is a cross-sectional view of a display apparatus according to an embodiment of the present disclosure.

As shown in FIG. 8, the display apparatus according to an embodiment of the present disclosure includes a thin film transistor substrate according to FIG. 1B, a planarization layer 150, a first electrode 160, a bank 170, and a light emitting layer 180, and a second electrode 190.

In FIG. 8, a thin film transistor substrate according to FIG. 1B is illustrated, but a thin film transistor substrate may be applied according to any one of FIGS. 2 to 7.

The planarization layer 150 is formed on the first source electrode S1, the first drain electrode D1, the second source electrode S2, and the second drain electrode D2. The planarization layers 150 may be formed of one or more materials of acrylic resin, epoxy resin, phenolic resin, polyamides resin, unsaturated polyesters resin, polyphenylene resin, polyphenylene sulfides resin, and benzocyclobutene, but embodiments are not limited thereto.

The first electrode 160 is provided on the planarization layer 150. The first electrode 160 may be connected to the first source electrode S1 through a contact hole provided in the planarization layer 150. The first electrode 160 may function as an anode. The first electrode 160 may comprise a metal material such as Au, W, Pt, Si, Ir, Ag, Cu, Ni, Ti, or Cr, and an alloy thereof. Alternatively, the first electrode 160 may include a transparent conductive material such as ITO indium tin oxide or IZO indium zinc oxide.

Although not shown, the first source electrode S1 and the first electrode 160 may not be directly connected, and may be electrically connected through the connection electrode between them. In this case, the planarization layer 150 is formed of a two-layer structure of a lower planarization layer and an upper planarization layer. The connection electrode may be electrically connected to the first source electrode S1 through a contact hole of the lower planarization layer, and the first electrode 160 may be connected to the connection electrode through a contact hole of the upper planarization layer.

The bank 170 is provided to cover the edge of the first electrode 160 to define the light emitting region. Therefore, the upper surface area of the first electrode 160, which is exposed without hidden by the bank 170, becomes the light emitting region.

The light emitting layer 180 is provided on the first electrode 160 and the bank 170. The light emitting layer 180 may include for example a red, green, and blue light emitting layer patterned for each pixel without being limited thereto, and may alternatively include light emitting layer of other color such as cyan, magenta or yellow, etc. patterned for each pixel, or may be made of a white light emitting layer connected with all pixels. When the light emitting layer 180 is made of a white light emitting layer, the light emitting layer 180 may include, for example, a first stack including a blue light emitting layer, a second stack including a yellow green light emitting layer, and a charge generation layer provided between the first and second stacks, but it is not necessarily limited to it. When the light emitting layer 180 is formed of a white light emitting layer, a color filter is provided for each pixel.

The second electrode 190 is provided on the light emitting layer 180. The second electrode 190 may function as a cathode. The cathode may be formed of Al, Al alloy, Ag, Ag Alloy, Mg, Mg alloy or APC (Ag—Pd—Cu) and the like.

Although not shown, an additional encapsulation layer may be formed to prevent the penetration of moisture or oxygen on the second electrode 190.

Figure 9:
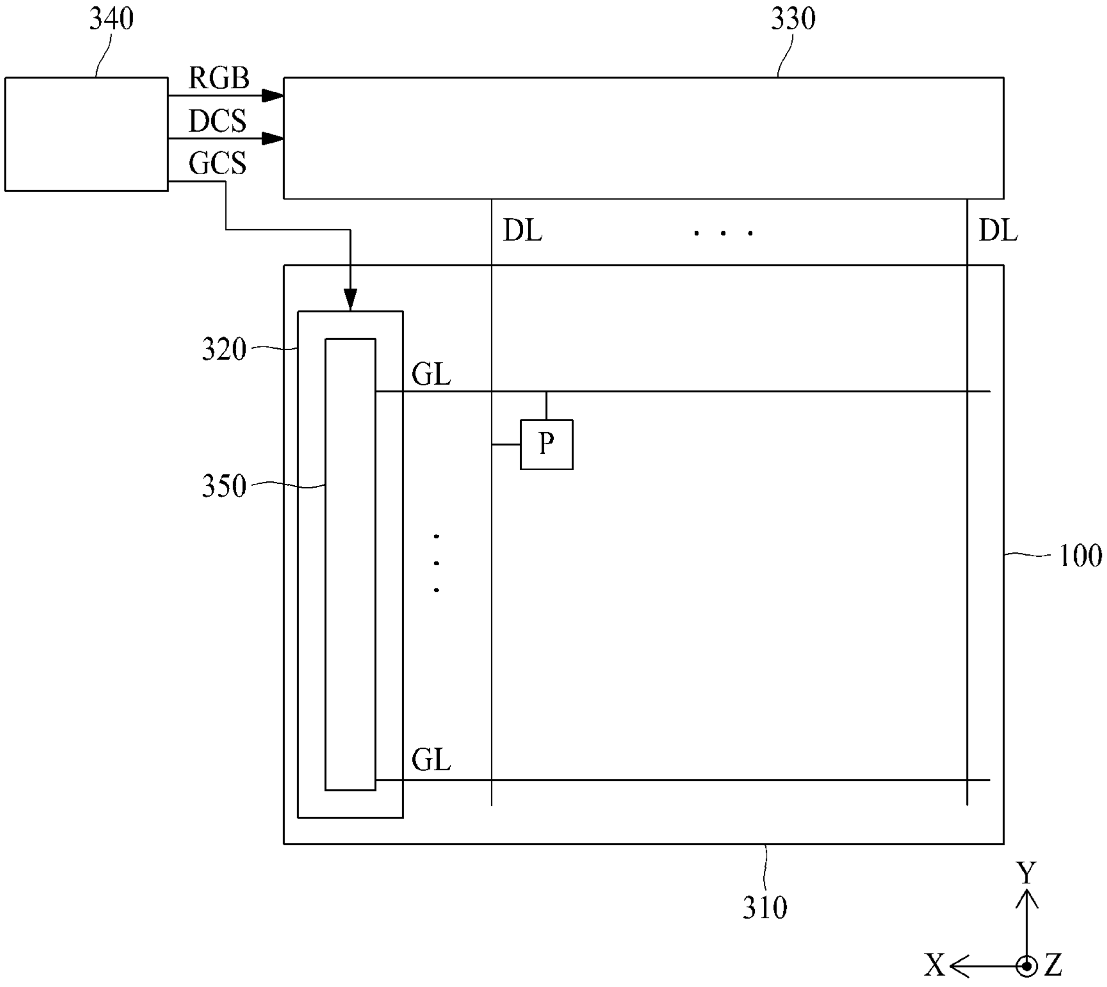
FIG. 9 is a schematic diagram of a display apparatus according to an exemplary embodiment of the present disclosure.

FIG. 9 is a schematic diagram of a display apparatus according to an embodiment of the present disclosure.

As shown in FIG. 9, the display apparatus according to an embodiment of the present disclosure may include a display panel 310, a gate driver 320, a data driver 330, and a controller 340. A different number of elements than shown may be included in the display apparatus.

The display panel 310 includes gate lines GLs and data lines DLs, and pixels P are disposed in respective crossing areas of the gate lines GLs and data lines DLs. An image is displayed by driving the pixel P. The gate lines GLs, the data lines DLs, and the pixels P may be disposed on the substrate 100. The first thin film transistor T1 and the second thin film transistor T2 described above may be provided in the pixel P.

The controller 340 controls the gate driver 320 and the data driver 330. The controller 340 outputs a gate control signal GCS for controlling the gate driver 320 and a data control signal DCS for controlling the data driver 330 by using a display driving control signal supplied from an external system (not shown). Also, the controller 340 samples input video data input from the external system and rearranges the sampled input video data, and supplies the rearranged digital video data RGB to the data driver 330. The controller 340 may control a driving operation and a driving timing of the data driver 330 by supplying the data control signal DCS to the data driver 330. The controller 340 may control a driving operation and a driving timing of the gate driver 320 by supplying the gate control signal GCS to the gate driver 320.

The gate control signal GCS includes a gate start pulse GSP, a gate shift clock GSC, a gate output enable signal GOE, a start signal Vst, a gate clock GCLK and the like. Further, control signals for controlling a shift register may be included in the gate control signal GCS.

The data control signal DCS includes a source start pulse SSP, a source shift clock signal SSC, a source output enable signal SOE, a polarity control signal POL and the like.

The data driver 330 supplies a data voltage to the data lines DL of the display panel 310. Specifically, the data driver 330 converts the video data inputted from the controller 340 into an analog data voltage every frame period by using a digital to analog converter (DAC) and supplies the data voltage to the data lines DL.

The gate driver 320 may be mounted on the display panel 310. As described above, a structure in which the gate driver 320 is directly mounted on the display panel 310 is referred to as a gate in panel (GIP) structure. Specifically, in the gate-in-panel (GIP) structure, the gate driver 320 may be disposed on the substrate 100. Alternatively, the gate driver 320 may be connected to a bonding pad of the display panel 310 by a chip on glass (COG) method or a chip on panel (COP) method, or may be connected to the display panel 310 by a chip on film (COF) method. Among the first thin film transistor TI and second thin film transistor T2 described above, the switching thin film transistor may be provided in the gate driver 320 having a gate in panel (GIP) structure.

The gate driver 320 may include a shift register 350.

The shift register 350 sequentially supplies gate pulses to the gate lines GL during one frame by the use of start signal and gate clock transmitted from the controller 340. Herein, the one frame refers to a period in which one image is outputted through the display panel 310. The gate pulse has a turn-on voltage capable of turning on a switching device (thin film transistor) disposed in the pixel P.

Also, during the remaining period of one frame, in which the gate pulse is not supplied, the shift register 350 supplies a gate-off signal capable of turning off the switching device to the gate line GL. Hereinafter, the gate pulse and the gate-off signal are totally referred to as a scan signal GS.

Figure 10:
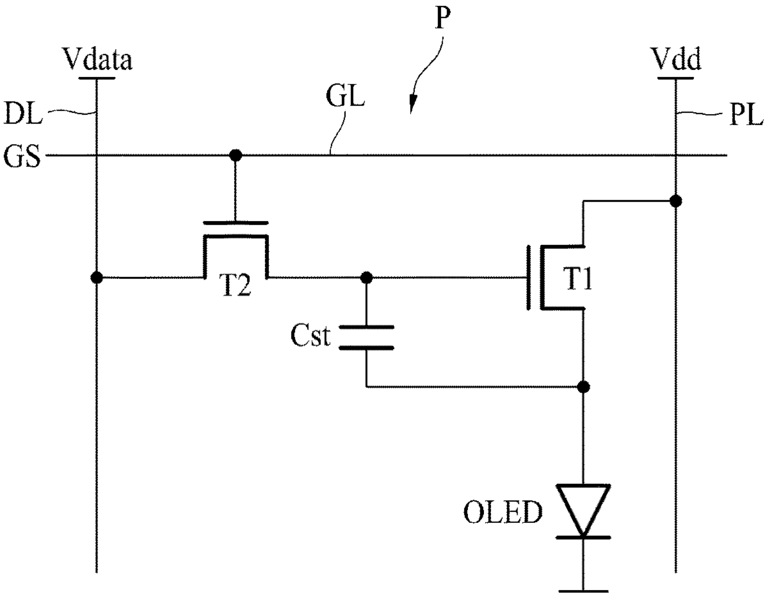
FIG. 10 is a circuit diagram of one pixel provided in a display apparatus according to an exemplary embodiment of the present disclosure.

FIG. 10 is a circuit diagram of one pixel provided in a display apparatus according to an embodiment of the present disclosure.

As shown in FIG. 10, the display apparatus according to an embodiment of present disclosure includes first to second thin film transistors T1 and T2 and capacitors Cst.

The first thin film transistor T1 is a driving thin film transistor, and the second thin film transistor T2 is a switching thin film transistor. At least one of the first thin film transistor T1 and the second thin film transistor T2 may be formed of the above-described various thin film transistors.

The first thin film transistor T1 is switched according to the data voltage Vdata supplied from the second thin film transistor T2, generates a data current from the driving voltage VDD supplied from the power line PL, and supplies it to the organic light emitting diode OLED.

The second thin film transistor T2 is switched according to the gate signal GS supplied to the gate line GL and supplies the data voltage Vdata supplied from the data line DL to the first thin film transistor T1.

The capacitor Cst serves to maintain the data voltage supplied to the first thin film transistor T1 for one frame, and is provided between the gate electrode and the source electrode of the first thin film transistor T1.

The organic light emitting diode OLED emits predetermined light according to a data current supplied from the first thin film transistor T1.

Figure 11:
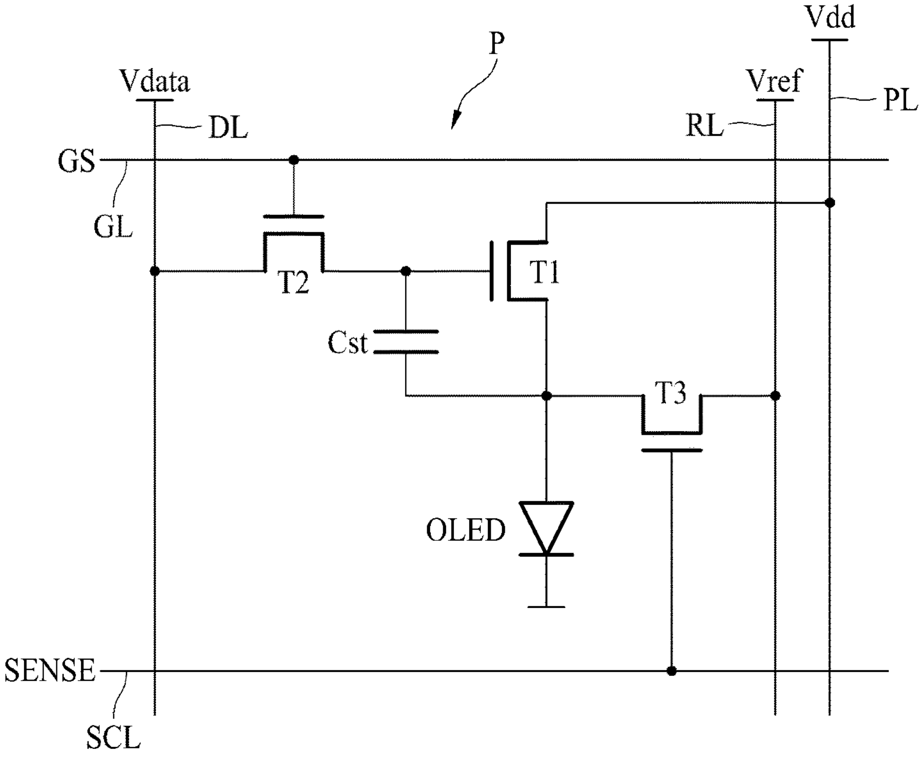
FIG. 11 is a circuit diagram of one pixel provided in a display apparatus according to another exemplary embodiment of the present disclosure.

FIG. 11 is a circuit diagram of one pixel provided in a display apparatus according to another embodiment of the present disclosure.

As shown in FIG. 11, the display apparatus according to another embodiment of present disclosure includes first to third thin film transistors T1, T2, T3 and a capacitor Cst.

The first thin film transistor T1 is a driving thin film transistor, and the second to third thin film transistors T2 to T3 are switching thin film transistors. At least one of the first to third thin film transistors T1, T2, and T3 may be formed of the above-described various thin film transistors.

The first thin film transistor T1 is switched according to the data voltage Vdata supplied from the second thin film transistor T2, generates a data current from the driving voltage VDD supplied from the power line PL, and supplies it to the organic light emitting diode OLED.

The second thin film transistor T2 is switched according to the gate signal GS supplied to the gate line GL and supplies the data voltage Vdata supplied from the data line DL to the first thin film transistor T1.

The third thin film transistor T3 supplies the current of the first thin film transistor T1 to the reference line RL in response to the sensing control signal SENSE supplied from the scan line SCL. A reference voltage Vref is supplied to the reference line RL.

The capacitor Cst serves to maintain the data voltage supplied to the first thin film transistor T1 for one frame, and is provided between the gate electrode and the source electrode of the first thin film transistor T1.

The organic light emitting diode OLED emits predetermined light according to a data current supplied from the first thin film transistor T1.

Figure 12:
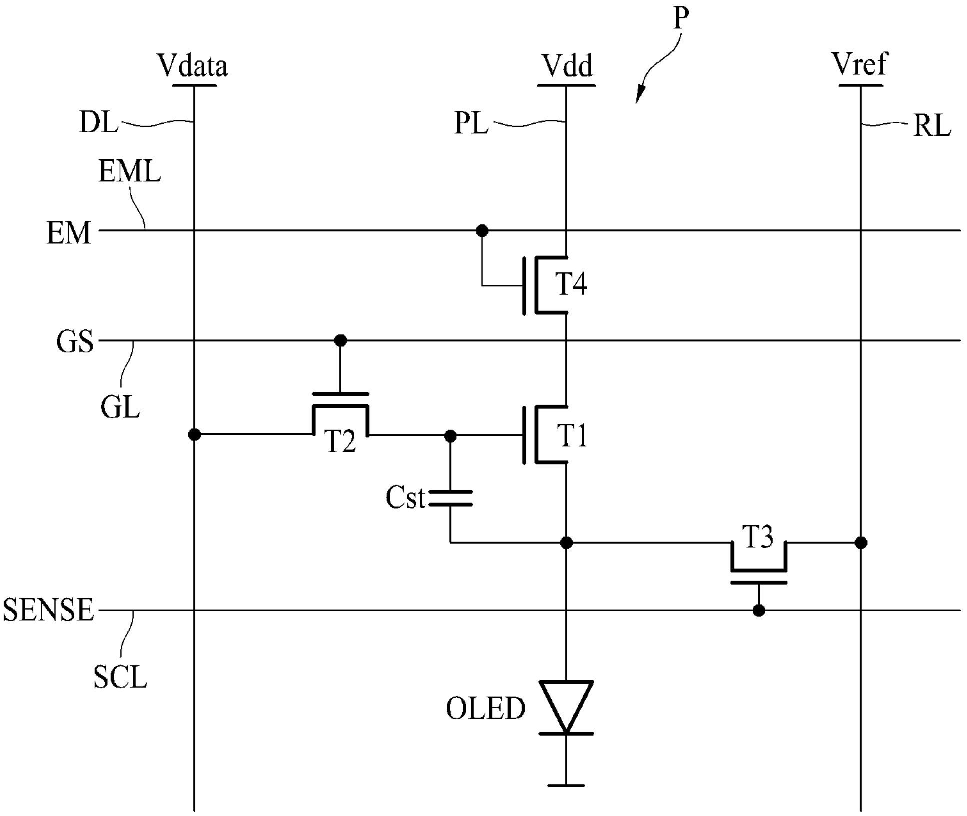
FIG. 12 is a circuit diagram of one pixel provided in a display apparatus according to another exemplary embodiment of the present disclosure.

FIG. 12 is a circuit diagram of one pixel provided in a display apparatus according to another embodiment of the present disclosure.

As shown in FIG. 12, the display apparatus according to another embodiment of the present disclosure includes first to fourth thin film transistors T1, T2, T3, and T4 and a capacitor Cst.

The first thin film transistor T1 is a driving thin film transistor, and the second to fourth thin film transistors T2 to T4 are switching thin film transistors. At least one of the first to fourth thin film transistors T1, T2, T3, and T4 may be formed of the above-described various thin film transistors.

The first thin film transistor T1 is switched according to the data voltage Vdata supplied from the second thin film transistor T2, generates a data current from the driving voltage VDD supplied from the power line PL, and supplies it to the organic light emitting diode OLED.

The second thin film transistor T2 is switched according to the gate signal GS supplied to the gate line GL and supplies the data voltage Vdata supplied from the data line DL to the first thin film transistor T1.

The third thin film transistor T3 supplies the current of the first thin film transistor T1 to the reference line RL in response to the sensing control signal SENSE supplied from the scan line SCL. A reference voltage Vref is supplied to the reference line RL.

The fourth thin film transistor T4 is switched according to the light emission control signal EM supplied to the light emission control line EML and supplies the driving voltage VDD supplied from the power line PL to the first thin film transistor T1.

The capacitor Cst serves to maintain the data voltage supplied to the first thin film transistor T1 for one frame, and is provided between the gate electrode and the source electrode of the first thin film transistor T1.

The organic light emitting diode OLED emits predetermined light according to a data current supplied from the first thin film transistor T1.

Accordingly, the present disclosure may have the following advantages.

According to an embodiment of present disclosure, since the first conductive layer and the second conductive layer is formed on both ends of the second active layer of the second thin film transistor, an ion doping process for the second active layer is not required. Only an ion doping process for the first active layer of the first thin film transistor is required, therefore, even if the first active layer and the second active layer are provided in different positions, there is no problem in which the characteristic uniformity between the first active layer and the second active layer will be lowered.

According to an embodiment of present disclosure, since the second active layer is formed of the same material as the first layer of the capacitor electrode by the same process, and the first conductive layer and the second conductive layer are formed of the same material as the second layer of the capacitor electrode, a separate process for forming the capacitor electrode is not required, and thus the process may be simply optimized.

According to another embodiment of present disclosure, since the second active layer of the second thin film transistor is formed by the same process as the first layer of the first gate electrode of the first thin film transistor, and the first conductive layer and the second conductive layer are formed by the same process as the second layer of the first gate electrode, a separate process for forming the first gate electrode is not required, and thus the process may be simply optimized.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A thin film transistor substrate comprising:

a substrate;

a first thin film transistor disposed on the substrate, the first thin film transistor including a first gate electrode, a first active layer, a first source electrode, and a first drain electrode;

a second thin film transistor disposed on the substrate, the second thin film transistor including a second gate electrode, a second active layer disposed on a different layer as the first active layer, a second source electrode, a second drain electrode, a first conductive layer disposed between the second active layer and the second source electrode, and a second conductive layer disposed between the second active layer and the second drain electrode; and a capacitor electrode including a first layer and a second layer disposed on the first layer, wherein the first layer of the capacitor electrode is on a same layer as the second active layer, and the second layer of the capacitor electrode is on a same layer as the first conductive layer, wherein the first layer of the capacitor electrode is in contact with the second layer of the capacitor electrode, wherein a first distance from the second active layer to the second gate electrode is greater than a second distance from the first active layer to the first gate electrode, and wherein the first gate electrode and the second gate electrode are disposed on a same layer, or the first gate electrode and the second gate electrode include a same material, and the second active layer is disposed below the first active layer.

2. The thin film transistor substrate according to claim 1, further comprising:

a first gate insulating layer disposed between the first active layer and the second active layer; and a second gate insulating layer disposed between the first active layer and the first gate electrode, wherein the first gate electrode and the second gate electrode are disposed on an upper surface of the second gate insulating layer.

3. The thin film transistor substrate according to claim 1, wherein the first active layer includes:

a first channel part overlapping the first gate electrode;

a first connection part disposed on a first side of the first channel part, the first connection part is in contact with the first source electrode;

a second connection part disposed on a second side of the first channel part, and the second connection part is in contact with the first drain electrode;

the second active layer includes a second channel part overlapping the second gate electrode;

a third connection part disposed on a first side of the second channel part, and the third connection part is in contact with the first conductive layer; and a fourth connection part disposed on a second side of the second channel part, and the fourth connection part is in contact with the second conductive layer.

4. The thin film transistor substrate according to claim 3, wherein the second active layer includes:

a first intermediate part disposed between the second channel part and the third connection part;

a second intermediate part disposed between the second channel part and the fourth connection part;

the first intermediate part overlaps a region between the second gate electrode and the first conductive layer; and the second intermediate part overlaps a region between the second gate electrode and the second conductive layer.

5. The thin film transistor substrate according to claim 1, wherein the capacitor electrode is electrically connected to the first source electrode and the capacitor electrode overlaps at least a portion of the first active layer.

6. The thin film transistor substrate according to claim 5, wherein the first active layer includes:

a first channel part overlapping the first gate electrode, a first connection part disposed on a first side of the first channel part, and the first connection part is in contact with the first source electrode;

a second connection part disposed on a second side of the first channel part, and the second connection part is in contact with the first drain electrode; and the capacitor electrode overlapping the first connection part, and the capacitor electrode not overlapping the second connection part.

7. The thin film transistor substrate according to claim 5, further comprising:

a light blocking layer overlapping at least a portion of the first active layer and the capacitor electrode below the capacitor electrode, wherein a capacitor comprises the light blocking layer and the capacitor electrode.

8. The thin film transistor substrate according to claim 7, wherein the first active layer includes:

a first channel part overlapping the first gate electrode, a first connection part disposed on a first side of the first channel part, and the first connection part in contact with the first source electrode;

a second connection part disposed on a second side of the first channel part, and the second connection part in contact with the first drain electrode;

the capacitor electrode overlapping the first connection part, and the capacitor electrode not overlapping the second connection part; and the light blocking layer overlapping the first connection part and the second connection part.

9. The thin film transistor substrate according to claim 1, further comprising:

a light blocking layer overlapping at least a portion of the second active layer, the light blocking layer electrically connected to the second source electrode, wherein a capacitor comprises the light blocking layer and the capacitor electrode.

10. A thin film transistor substrate comprising:

a substrate;

a first thin film transistor disposed on the substrate, the first thin film transistor including a first gate electrode, a first active layer, a first source electrode, and a first drain electrode; and a second thin film transistor disposed on the substrate, the second thin film transistor including a second gate electrode, a second active layer on a different layer from the first active layer, a second source electrode, a second drain electrode, a first conductive layer disposed between the second active layer and the second source electrode, and a second conductive layer disposed between the second active layer and the second drain electrode, wherein the first gate electrode includes a first layer and a second layer disposed on the first layer, and the first layer of the first gate electrode is disposed on a same layer as the second active layer or the first layer of the first gate electrode contains a same material as the second active layer, and the second layer of the first gate electrode is disposed on a same layer as the first conductive layer or the second layer of the first gate electrode contains a same material as the first conductive layer.

11. The thin film transistor substrate according to claim 10, further comprising:

a first gate insulating layer disposed between the first active layer and the second active layer; and a second gate insulating layer disposed between the second active layer and the second gate electrode, wherein the first gate electrode and the second active layer are disposed on an upper surface of the first gate insulating layer.

12. The thin film transistor substrate according to claim 10, wherein the first gate electrode is disposed below the second gate electrode, and the first active layer is disposed below the second active layer.

13. The thin film transistor substrate according to claim 10, wherein the first active layer includes:

a first channel part overlapping the first gate electrode, a first connection part disposed on a first side of the first channel part, and the first connection part is in contact with the first source electrode;

a second connection part disposed on a second side of the first channel part, and the second connection part is in contact with the first drain electrode;

the second active layer includes a second channel part overlapping the second gate electrode;

a third connection part disposed on a first side of the second channel part and the third connection part is in contact with the first conductive layer; and a fourth connection part disposed on a second side of the second channel part and the fourth connection part is in contact with the second conductive layer.

14. The thin film transistor substrate according to claim 13, wherein the second active layer includes:

a first intermediate part disposed between the second channel part and the third connection part;

a second intermediate part disposed between the second channel part and the fourth connection part;

the first intermediate part overlapping a region between the second gate electrode and the first conductive layer; and the second intermediate part overlapping a region between the second gate electrode and the second conductive layer.

15. The thin film transistor substrate according to claim 10, further comprising:

a light blocking layer electrically connected to the first source electrode, wherein the light blocking layer overlaps at least a portion of the first active layer.

16. The thin film transistor substrate according to claim 15, wherein the first active layer includes:

a first channel part overlapping the first gate electrode;

a first connection part disposed on a first side of the first channel part and the first connection part is in contact with the first source electrode;

a second connection part disposed on a second side of the first channel part and the second connection part is in contact with the first drain electrode; and the light blocking layer overlapping the first connection part and the light blocking layer not overlapping the second connection part.

17. The thin film transistor substrate according to claim 10, further comprising:

a light blocking layer overlapping at least a portion of the second active layer, the light blocking layer electrically connected to the second source electrode.

18. A display apparatus comprising:

a thin film transistor substrate according to claim 1;

a first electrode disposed on the thin film transistor substrate;

a light emitting layer disposed on the first electrode; and a second electrode disposed on the light emitting layer.

* * * * *